(12) United States Patent
Griffiths

(10) Patent No.: US 7,683,685 B2
(45) Date of Patent: Mar. 23, 2010

(54) SYSTEM AND METHOD FOR IMPLEMENTING A DIGITAL PHASE-LOCKED LOOP

(75) Inventor: Bernard J. Griffiths, Ben Lomond, CA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 0 days.

(21) Appl. No.: 12/012,677

(22) Filed: Feb. 5, 2008

(65) Prior Publication Data

US 2009/0195276 A1 Aug. 6, 2009

(51) Int. Cl.
*H03L 7/06* (2006.01)

(52) U.S. Cl. .......................... 327/159; 327/160; 331/16; 331/17

(58) Field of Classification Search .................. 327/156, 327/159, 160; 331/16, 17
See application file for complete search history.

(56) References Cited

U.S. PATENT DOCUMENTS

| | | | | |
|---|---|---|---|---|
| 4,179,670 A | * | 12/1979 | Kingsbury | 331/10 |
| 5,373,255 A | * | 12/1994 | Bray et al. | 331/1 A |
| 5,500,627 A | * | 3/1996 | Hulsing, II | 331/1 A |
| 6,407,642 B2 | * | 6/2002 | Dosho et al. | 331/11 |
| 6,496,556 B1 | * | 12/2002 | Huehne et al. | 377/2 |
| 6,580,376 B2 | * | 6/2003 | Perrott | 341/61 |
| 6,630,868 B2 | | 10/2003 | Perrott et al. | |
| 6,778,024 B2 | | 8/2004 | Gupta et al. | |
| 6,798,297 B1 | * | 9/2004 | Kwan et al. | 331/10 |
| 6,803,827 B1 | | 10/2004 | Kenney et al. | |
| 2008/0007311 A1 | * | 1/2008 | Choi | 327/156 |

* cited by examiner

*Primary Examiner*—Lincoln Donovan
*Assistant Examiner*—William Hernandez
(74) *Attorney, Agent, or Firm*—Gregory J. Koerner; Redwood Patent Law

(57) ABSTRACT

An apparatus for implementing a digital phase-locked loop includes a voltage-controlled oscillator that generates a primary clock signal in response to a VCO control voltage. Detection means generates counter control signals, including count up signals and count down signals, to indicate a current relationship between the primary clock signal and a reference signal. An up/down counter then either increments or decrements a counter value in response to corresponding counter control signals. The counter value is then converted by a digital-to-analog converter into the VCO control voltage for adjusting the frequency of the primary clock signal generated by the voltage-controlled oscillator. In alternate embodiments, the foregoing up/down counter may be utilized to adjust the frequency of the voltage-controlled oscillator in proportion to the counter value by utilizing appropriate techniques other than generating a VCO control voltage with a digital-to-analog converter.

11 Claims, 11 Drawing Sheets

SYSTEM AND METHOD FOR IMPLEMENTING A DIGITAL PHASE-LOCKED LOOP

BACKGROUND SECTION

1. Field of the Invention

This invention relates generally to techniques for transferring electronic information, and relates more particularly to a system and method for implementing a digital phase-locked loop.

2. Description of the Background Art

Implementing effective methods for transferring electronic information is a significant consideration for designers and manufacturers of contemporary electronic systems. However, effectively implementing data transfer systems may create substantial challenges for system designers. For example, enhanced demands for increased system functionality and performance may require more system processing power and require additional hardware resources. An increase in processing or hardware requirements may also result in a corresponding detrimental economic impact due to increased production costs and operational inefficiencies.

Furthermore, enhanced system capability to perform various advanced transfer operations may provide additional benefits to a system user, but may also place increased demands on the control and management of various system components. For example, an enhanced electronic system that effectively transfers digital image data may benefit from an effective implementation because of the large amount and complexity of the digital data involved.

Due to growing demands on system resources and substantially increasing data magnitudes, it is apparent that developing new techniques for implementing and utilizing data transfer systems is a matter of concern for related electronic technologies. Therefore, for all the foregoing reasons, developing effective systems for transferring electronic information remains a significant consideration for designers, manufacturers, and users of contemporary electronic systems.

SUMMARY

In accordance with the present invention, a system and method are disclosed for effectively implementing a digital phase-locked loop. In accordance with one embodiment of the present invention, a phase-locked loop (PLL) performs a clock regeneration procedure to regenerate a primary clock signal for synchronizing any appropriate devices or processes. Initially, a voltage-controller oscillator (VCO) generates the primary clock signal. A phase/frequency detector compares the primary clock signal to a reference signal and provides either an up signal or a down signal to a charge pump, depending upon whether the frequency of the primary clock signal needs to be raised or lowered in order to match the reference signal. The charge pump then provides a charge pump output current to a loop filter comprised of a capacitor C2, a resistor Rd, and a capacitor C1. The loop filter then provides a loop filter voltage to a summing node.

In a first embodiment, the phase/frequency detector also provides the foregoing up signal and down signal to a phase error detector that generates a corresponding count up signal and a count down signal to an up/down counter. The phase error detector generates the count up signal in response to a phase-error (PE) clock when the up signal from the phase/frequency detector is active. Conversely, the phase error detector generates the count down signal in response to the phase-error (PE) clock when the down signal from the phase/frequency detector is active.

In a second embodiment, the loop filter provides the foregoing loop filter voltage to a level detector that generates a count up signal and a count down signal to the up/down counter. The level detector uses an upper comparator that activates the count up signal when the loop filter voltage is above a predefined upper threshold. Conversely, the level detector uses a lower comparator that activates the count down signal when the loop filter voltage is below a predefined lower threshold voltage.

In both the first and second embodiments, when the count up signal is active, the up/down counter sequentially increments a counter value in response to a counter clock. Conversely, when the count down signal is active, the up/down counter sequentially decrements the counter value in response to the counter clock. The up/down counter then provides the counter value to a digital-to-analog converter (DAC) that converts the counter value into an analog drive voltage that is provided to the summing node. The summing node combines the drive voltage with the foregoing loop filter voltage to thereby generate a VCO control voltage for adjusting the frequency of the primary clock signal generated by the VCO.

In alternate embodiments, the foregoing up/down counter may be utilized to adjust the frequency of the VCO in proportion to the counter value by utilizing appropriate techniques other than generating a VCO control voltage with a digital-to-analog converter. For example, the counter value may be utilized to control the VCO in proportion to the counter value by controlling a current value, a capacitance value, or a total number of delay elements. For at least the foregoing reasons, the present invention therefore provides an improved system and method for implementing a digital phase-locked loop.

DETAILED DESCRIPTION

The present invention relates to an improvement in data transmission systems. The following description is presented to enable one of ordinary skill in the art to make and use the invention, and is provided in the context of a patent application and its requirements. Various modifications to the disclosed embodiments will be readily apparent to those skilled in the art, and the generic principles herein may be applied to other embodiments. Thus, the present invention is not intended to be limited to the embodiments shown, but is to be accorded the widest scope consistent with the principles and features described herein.

The present invention is described herein as an apparatus for implementing a digital phase-locked loop, and includes a voltage-controlled oscillator that generates a primary clock signal in response to a VCO control voltage. Detection means generates counter control signals, including count up signals and count down signals, to indicate a current relationship between the primary clock signal and a reference signal. An up/down counter then either increments or decrements an internal counter value in response to corresponding counter control signals. The counter value is then converted by a digital-to-analog converter into the analog VCO control voltage for adjusting the frequency of the primary clock signal generated by the voltage-controlled oscillator. In alternate embodiments, the foregoing up/down counter may be utilized to adjust the frequency of the voltage-controlled oscillator in proportion to the counter value by utilizing appropriate techniques other than generating a VCO control voltage with a digital-to-analog converter.

Figure 1:
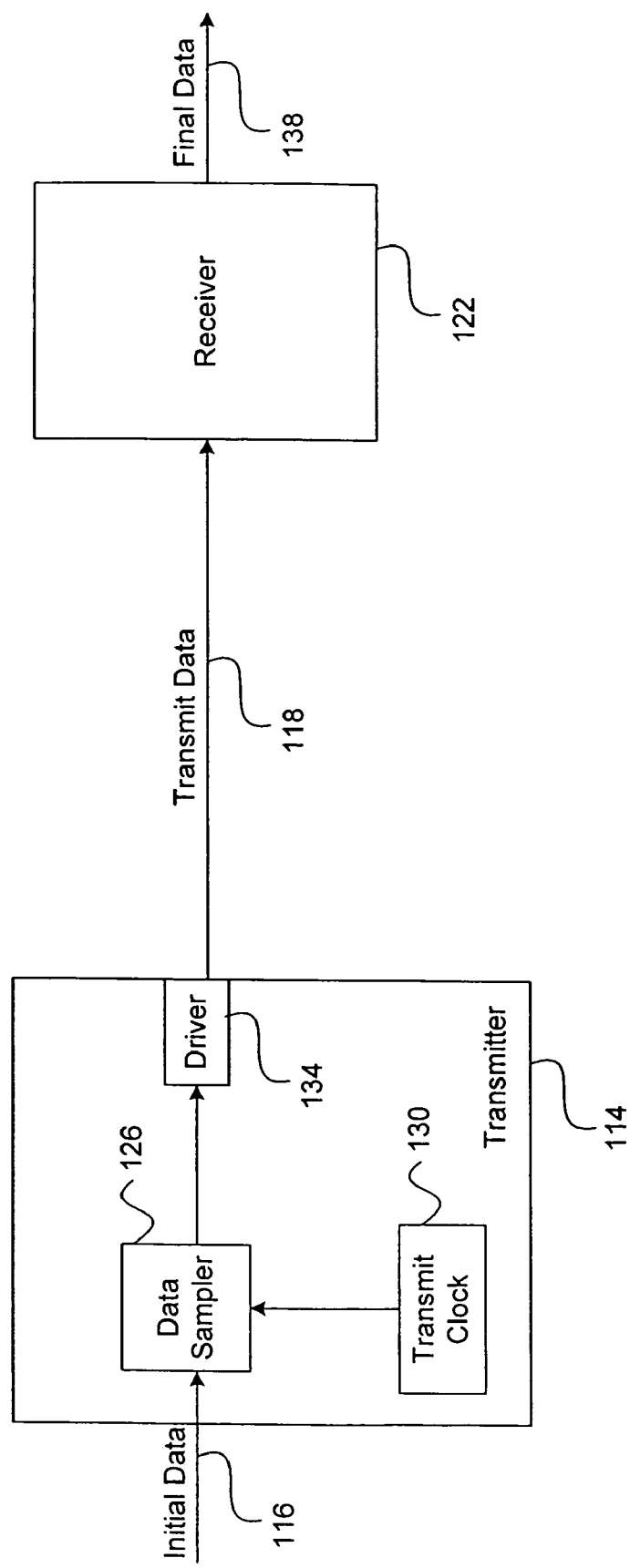
FIG. 1 is a block diagram of a data transmission system, in accordance with one embodiment of the present invention.

Referring now to FIG. 1, a block diagram of a data transmission system 110 is shown, in accordance with one embodiment of the present invention. In the FIG. 1 embodiment, data transmission system 110 includes, but is not limited to, a transmitter 114 and a receiver 122. In alternate embodiments, data transmission system 110 may be implemented using components and configurations in addition to, or instead of, certain of those components and configurations discussed in conjunction with the FIG. 1 embodiment.

In the FIG. 1 embodiment of data transmission system 110, a transmitter 114 utilizes a data sampler 126 to receive initial data 116 from any appropriate data source. Data sampler 126 synchronizes the initial data 116 with reference to a transmit clock 130. A driver 134 then outputs the synchronized initial data 116 over any appropriate type of transmission channel as transmit data 118. A receiver 122 of data transmission system 110 may then receive and process the transmit data 118 to thereby provide final data 138 to any appropriate data destination.

Data transmission system 110 therefore may transfer any desired type of electronic data or information between two separate locations via a transmission channel. These locations may be considerably distant (for example, between continents or between satellites), or may alternately be relatively close to each other (for example, between devices inside electronic equipment). A wide range of physical transmission media may be used to facilitate this transmission. Examples include electromagnetic waves in free space (wireless transmission), or electromagnetic waves in a constrained media (optical fiber, waveguides, cables, etc.).

This transmit data 118 is typically processed into a format that is suitable for transmission across the channel in a manner that maximizes intelligibility (a low incidence of error at the receiver 122, that has a low bit-error rate (BER), that maximizes the data throughput rate (measured in bits/second or symbols/second), and that minimizes certain cost factors such as transmission power, implementation complexity, and maximize spectral efficiency.

One method of processing involves serializing the initial data 116 before transmission, so that each data bit is represented by a unique symbol. These symbols are transmitted across the channel at a particular rate, controlled by transmit clock 130 of transmitter 114. To accurately receive and deserialize these encoded symbols with a low BER, the receiver 122 may regenerate a local receiver clock that is similar to the transmit clock 130 of transmitter 114 with respect to frequency and phase. This synchronization of the receiver clock to the frequency and phase of incoming transmit data 118 may be advantageously performed by a Phase Locked Loop (PLL) device during a clock regeneration procedure. Further details regarding the implementation and utilization of receiver 122 are further discussed below in conjunction with FIGS. 2-10.

Figure 2:
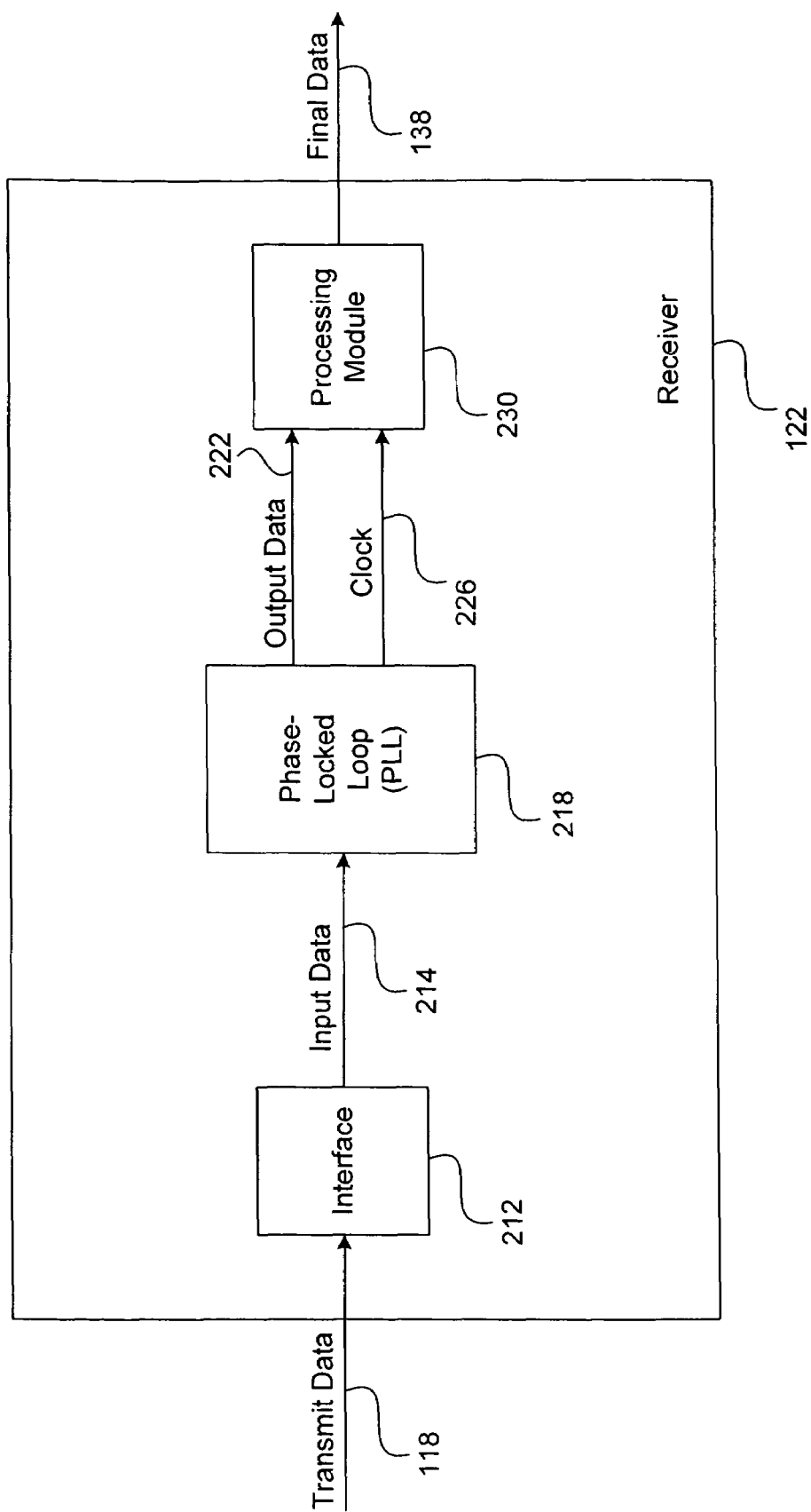
FIG. 2 is a block diagram for one embodiment of the receiver of FIG. 1, in accordance with the present invention.

Referring now to FIG. 2, a block diagram for one embodiment of the FIG. 1 receiver 122 is shown, in accordance with the present invention. In the FIG. 2 embodiment, receiver 122 may include, but is not limited to, an interface 212, a phase-locked loop (PLL) 218, and a processing module 230. In alternate embodiments, receiver 122 may be implemented using components and configurations in addition to, or instead of, certain of those components and configurations discussed in conjunction with the FIG. 2 embodiment. In various embodiments, receiver 122 may be implemented as any other appropriate type of electronic device.

In the FIG. 2 embodiment, transmit data 118 may be received from any desired data source, and may be encoded in any appropriate data format. For example, in certain embodiments, transmit data 118 may be received from a transmitter 114 of a data transmission system 110 (FIG. 1). In the FIG. 2 embodiment, an interface 212 of receiver 122 converts transmit data 118 into corresponding input data 214. In the FIG. 2 embodiment, a phase-locked loop (PLL) 218 receives input data 214, and responsively performs a clock regeneration procedure to produce a clock signal 226. A processing module 230 may receive output data 222 and clock 226 for performing any appropriate processing procedures to thereby produce final data 138. Certain additional details for the implementation and utilization of PLL 218 are further discussed below in conjunction with FIGS. 3-10.

Figure 3:
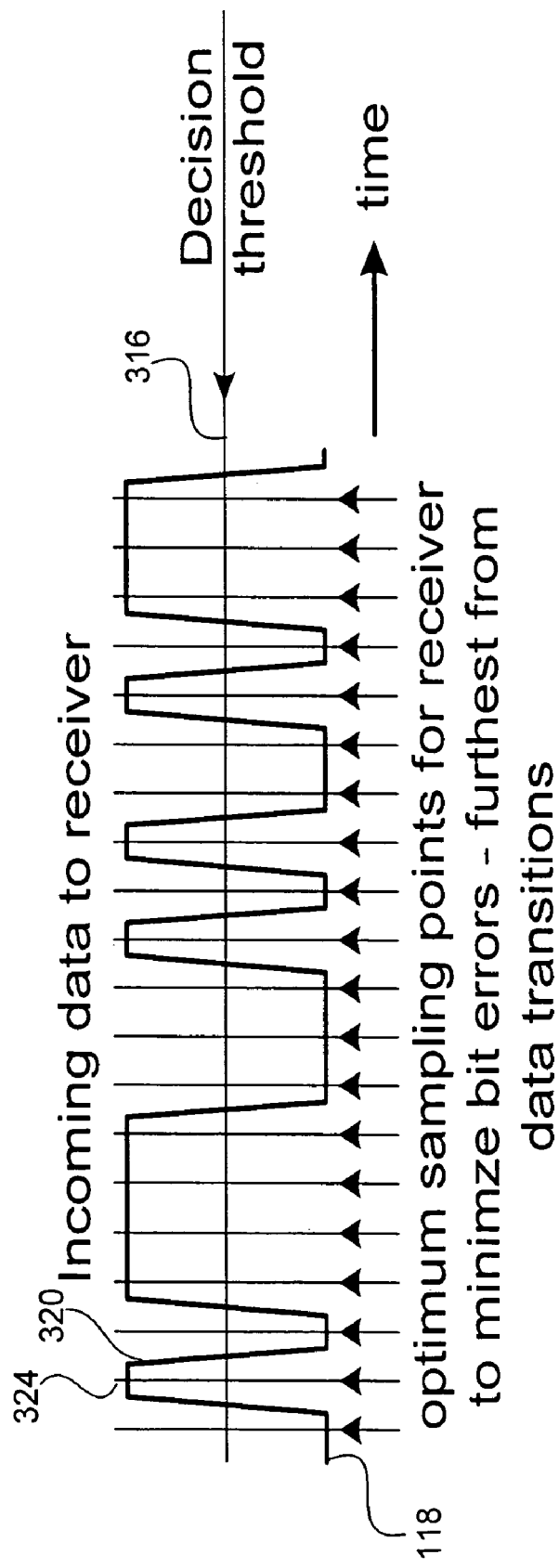
FIG. 3 is a diagram illustrating optimum data sampling points, in accordance with one embodiment of the present invention.

Referring now to FIG. 3, a diagram illustrating optimum data sampling points is shown, in accordance with one embodiment of the present invention. The FIG. 3 diagram is presented for purposes of illustration, and in alternate embodiments, the present invention may utilize techniques and timing relationships in addition to, or instead of, certain of those techniques and timing relationships discussed in conjunction with the FIG. 3 embodiment.

In the FIG. 3 embodiment, exemplary pulses of incoming data 118 to receiver 122 (FIG. 1) are shown. A decision threshold 316 for determining either a high or low state for incoming data 118 is also shown. The FIG. 3 embodiment also shows a sequence of optimal sampling points for receiver 122 to read the current state of the pulses of incoming data 118. For example, the FIG. 3 diagram shows a first pulse 320 of incoming data 118 aligned with a corresponding optimum sampling point that occurs at time 324.

Because of various potential types of noise, transition edge skewing, jitter, and other signal artifacts on the rising or falling transitions of incoming data 118, receiver 122 requires a regenerated clock 226 that aligns incoming data 118 so that the data sampling points occur during the middle of the corresponding data pulses (away from the respective transition edges). To accurately determine the clock phase error, receiver 122 must make a decision regarding the temporal position of an incoming data transition with respect to the receiver local clock 226.

Therefore, receiver 122 defines one or more decision thresholds 316, and when the incoming data 118 crosses decision threshold 316, receiver 122 is able to determine phase information. Receiver 122 may thus align the receiver local clock 226 (FIG. 2) to the optimum time position with respect to the incoming data 118. The receiver local clock 226 is then able to sample the incoming data 118, and then using the same or another decision threshold 316, make a determination as to the state of the received bits. The FIG. 3 diagram illustrates the relationship between the incoming data 118 and the optimum sampling points aligned with the regenerated phase-locked clock 226 of receiver 122. As discussed above, the optimum sampling points are in the center of the pulses of the incoming data 118. In other words, the optimum sampling points are at locations furthest from the adjacent data transitions.

Figure 4:
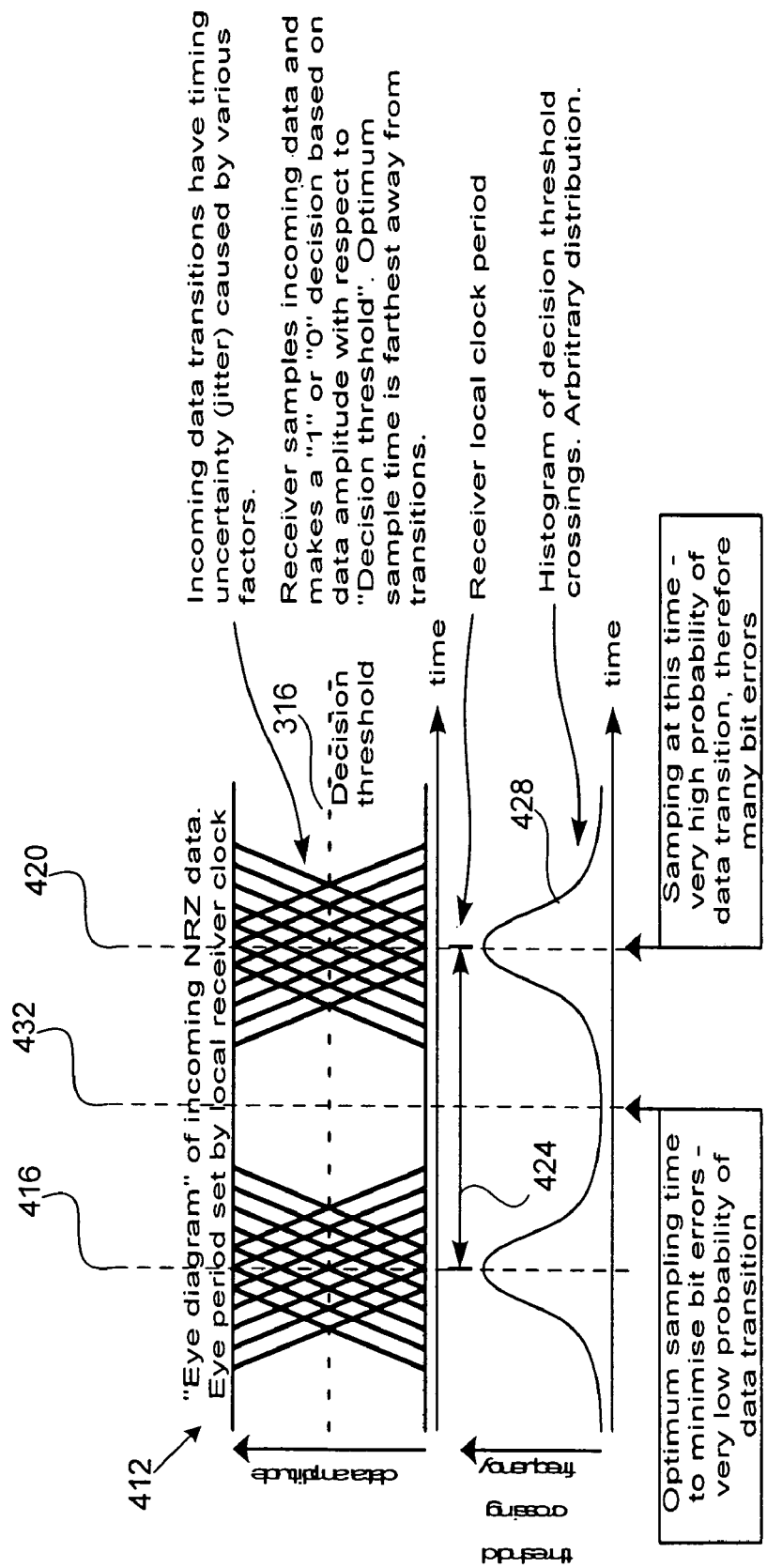
FIG. 4 is an eye diagram and corresponding histogram, in accordance with one embodiment of the present invention.

Referring now to FIG. 4, an eye diagram 412 and corresponding histogram 428 are shown to illustrate optimal clock timing characteristics, in accordance with one embodiment of the present invention. The FIG. 4 eye diagram 412 and histogram 428 are presented for purposes of illustration. In alternate embodiments, the present invention may utilize techniques and timing relationships in addition to, or instead of, certain of those techniques and timing relationships discussed in conjunction with the FIG. 4 embodiment.

The incoming data 118 to the receiver 122 (FIG. 1) exhibits variations in bit width over time. Such variation is termed jitter. Jitter includes a random component caused, for example, by noise at the transmitter 114 and/or in the environment. Jitter also includes a deterministic component caused, for example, by attenuation and bandwidth-limiting in the transmission channel and/or interference from other sources. The presence of jitter causes the incoming data transitions to move temporally with respect to the receiver local clock 226.

If the jitter is too great, or if the receiver clock 226 is poorly phase-aligned to the incoming data 118, then bit errors may likely increase in the receiver 122 as the receiver clock 226 samples closer to data transitions with a higher probability of making an error in the bit state determination. This phenomenon is demonstrated in FIG. 4. Eye diagram 412 is a plot of the incoming data 118, after being divided into segments corresponding to individual bit periods, each of the segments then being superimposed over the other segments in an eye diagram 412.

The eye region shown between time 416 and time 420, shows multiple superimposed data transitions, and how the transitions vary in time from a single ideal transition due to factors such as jitter. In the FIG. 4 embodiment, histogram 428 shows data transition frequency versus time. As shown in histogram 428, if receiver 122 samples close to the peaks of the histogram 428, then there is a higher probability that receiver 122 will make an erroneous bit-state determination. Therefore, the optimum sampling point is located at time 432 which is midway between the histogram peaks shown at times 416 and 420. In accordance with the present invention, accurately regenerating a local clock 226 allows receiver 122 to position optimum sampling points at time 432 to thereby advantageously tolerate a greater amount of jitter at a particular error rate.

Figure 5:
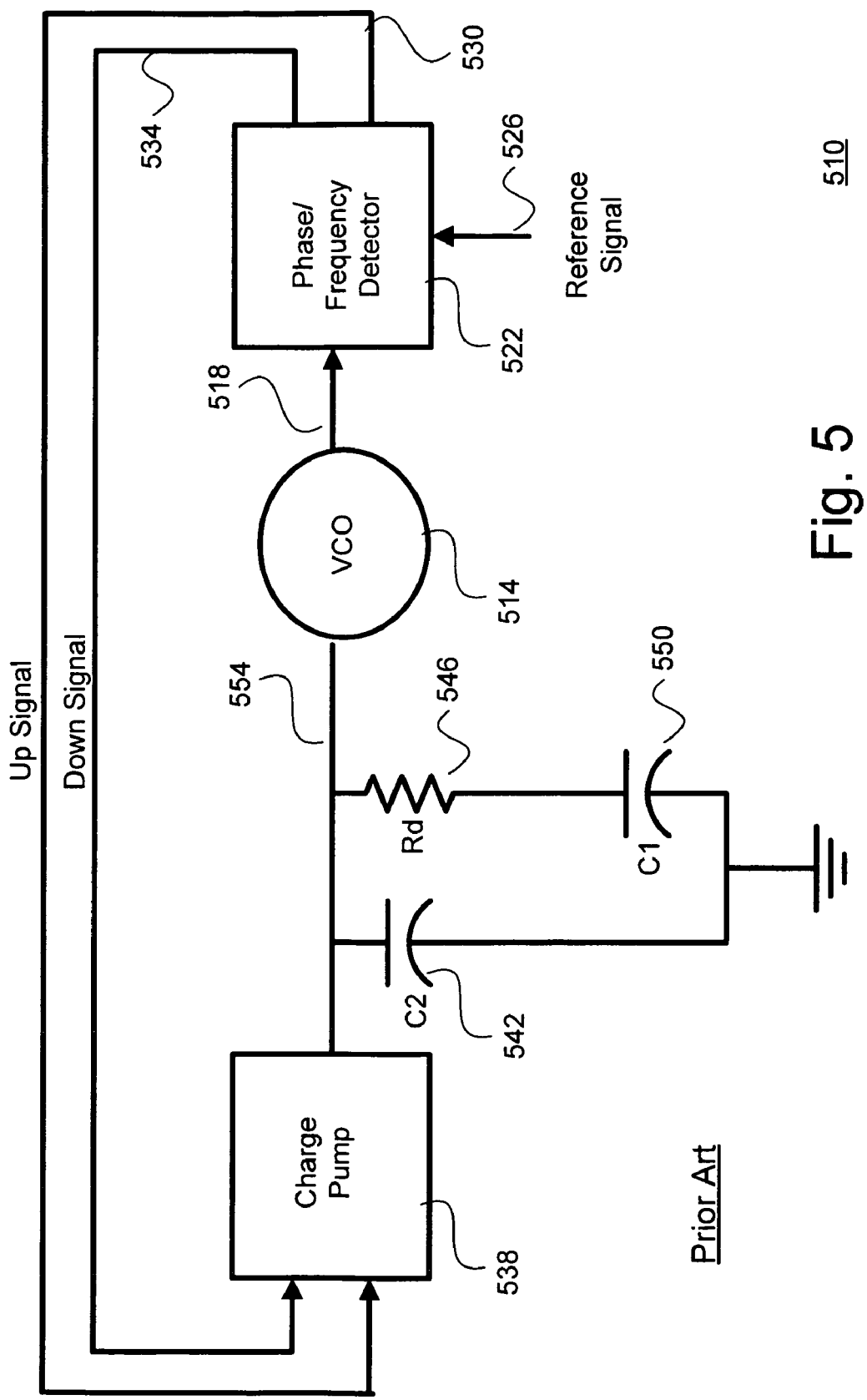
FIG. 5 is a schematic diagram for one embodiment of a phase-locked loop.

Referring now to FIG. 5, a schematic diagram for one embodiment of a phase-locked loop (PLL) 510 is shown. In the FIG. 5 embodiment, PLL 510 may include, but is not limited to, a voltage-controlled oscillator (VCO) 514, a phase/frequency detector 522, a charge pump 538, and a loop filter (capacitor C2 (542), resistor Rd (546), and capacitor C1 (550)). In alternate embodiments, PLL 510 may be implemented using components and configurations in addition to, or instead of, certain of those components and configurations discussed in conjunction with the FIG. 5 embodiment.

In the FIG. 5 embodiment, PLL 510 performs a clock regeneration procedure to regenerate a clock signal 518 for synchronizing any appropriate devices or processes (for example, the receiver 122 of FIG. 2). In the FIG. 5 embodiment, a Voltage-Controller Oscillator (VCO) 514 generates the clock signal 518. Phase/frequency detector 522 compares the clock signal 518 to a reference signal 526 and provides either an up signal 530 or a down signal 534 to charge pump 538, depending upon whether the frequency of clock signal 518 needs to be raised or lowered to match reference signal 526. Charge pump 538 then provides charge pump output current to a loop filter comprised of capacitor C2 (542), resistor Rd (546), and capacitor C1 (550). The components of the loop filter provide a VCO control voltage 554 to adjust the frequency of the clock signal 518 generated by VCO 514.

One problem with the PLL 510 of FIG. 5 is that capacitor C1 (550) is typically required to be implemented with a relatively large capacitance value which also results in a correspondingly large physical size. When implementing PLL 510 as an integrated circuit, the large size of capacitor C1 (550) prohibits its implementation as part of the integrated circuit, and instead, capacitor C1 (550) must typically be implemented as an external capacitor. This external implementation disadvantageously results in additional connection requirements, increased power consumption, and requires additional valuable physical space for implementing PLL 510. Alternate improved techniques for effectively implementing phase-locked loops by utilizing digital technology are further discussed below in conjunction with FIGS. 7-10.

Figure 6:
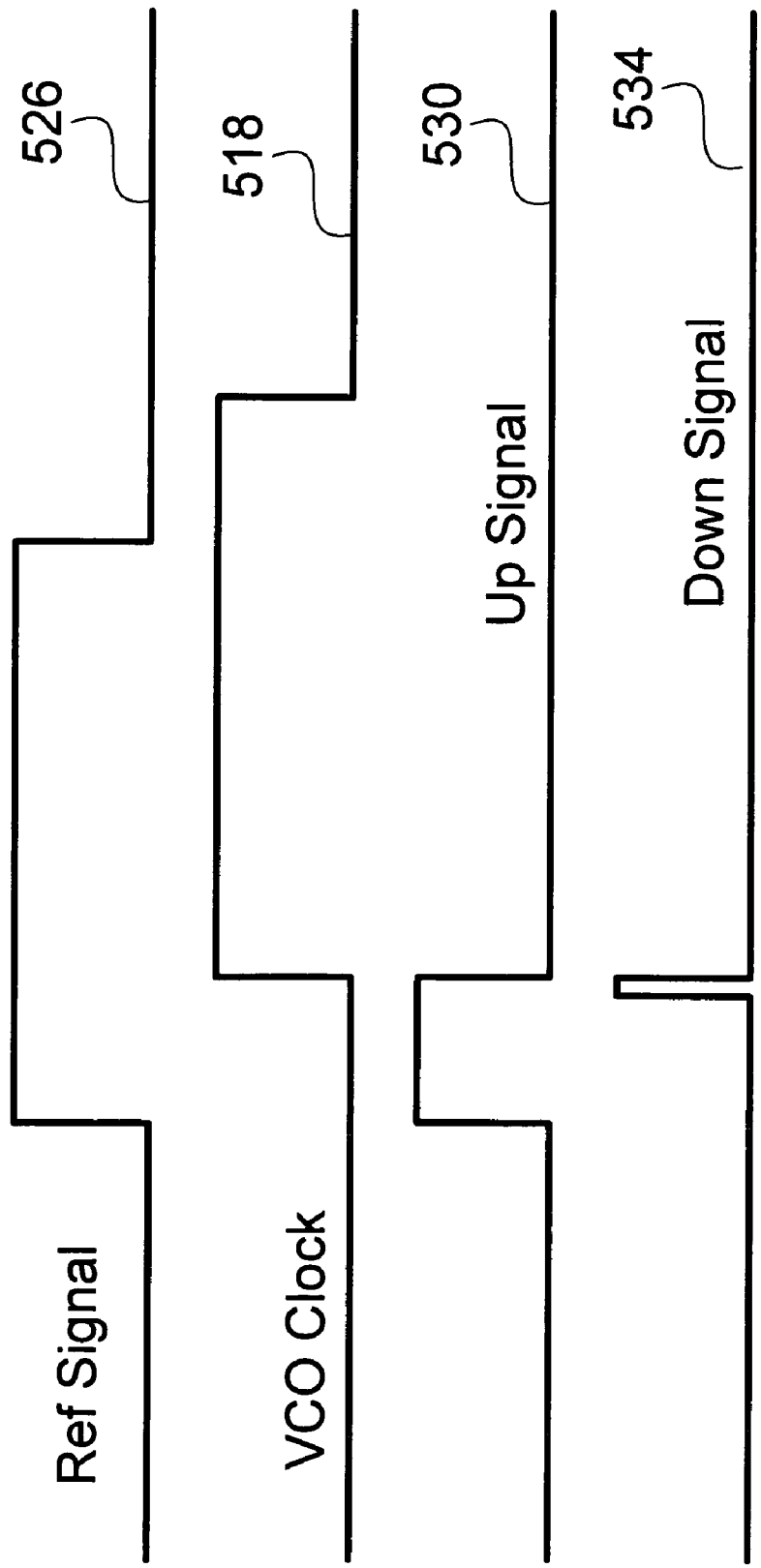
FIG. 6 is a timing diagram for one embodiment of a phase/frequency detector.

Referring now to FIG. 6, a timing diagram for a phase/frequency detector is shown, in accordance with one embodiment of the present invention. The FIG. 6 timing diagram is presented for purposes of illustration, and in alternate embodiments, phase/frequency detectors may be implemented using waveforms and timing relationships in addition to, or instead of, certain of those waveforms and timing relationships discussed in conjunction with the FIG. 6 embodiment.

In the FIG. 6 example, reference signal 526 (see FIG. 5) is shown leading clock signal 518 to generate an up signal pulse 530 (see FIG. 5) for causing a clock VCO to increase its output frequency. In other circumstances, phase/frequency detectors may similarly generate a down signal pulse 534 (see FIG. 5) when the clock signal 518 leads the reference signal 526. The utilization of similar phase/frequency detectors is further discussed below in conjunction with FIGS. 7-10.

Figure 7:
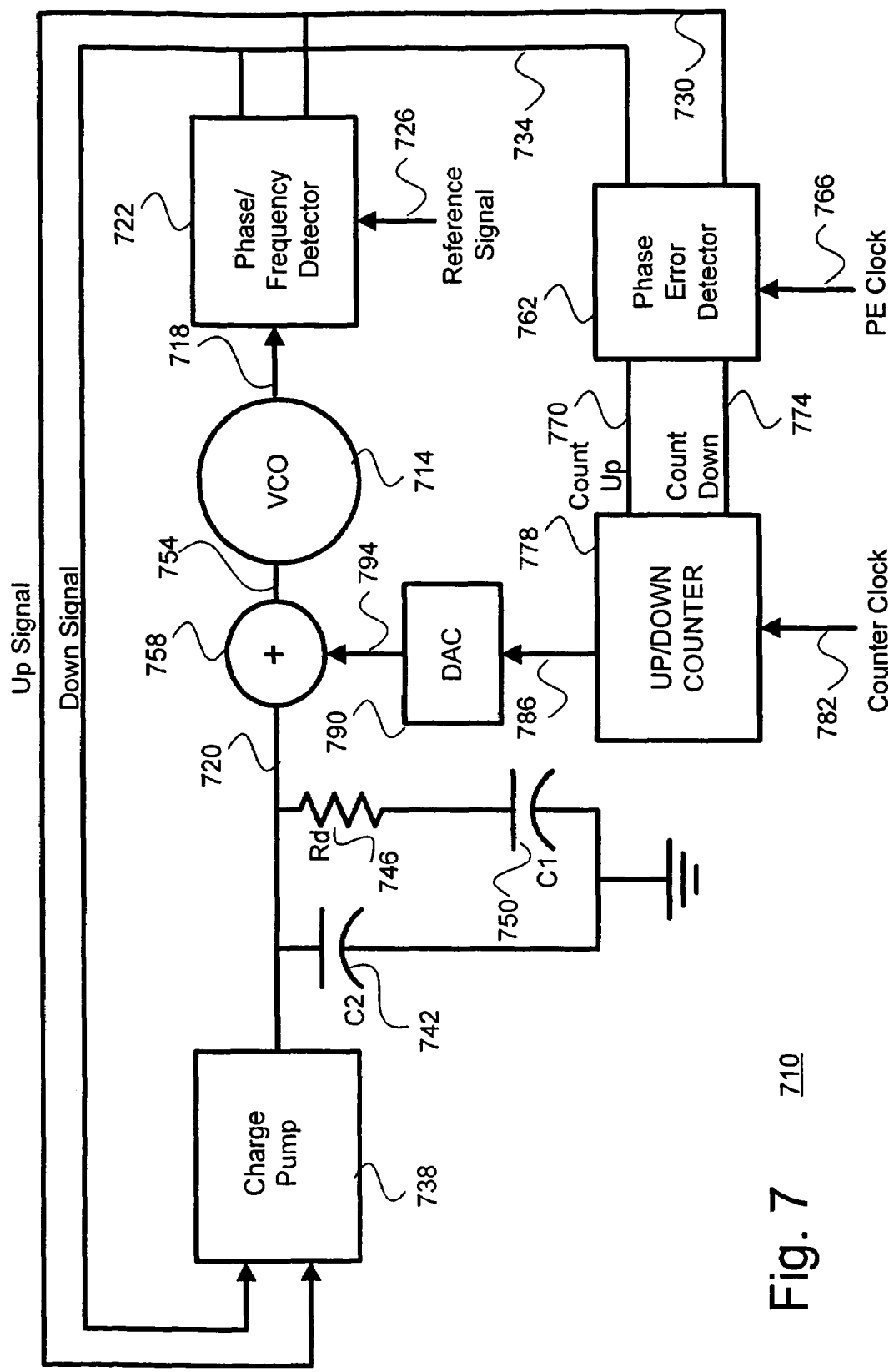
FIG. 7 is a schematic diagram for one embodiment of a phase-locked loop, in accordance with the present invention.

Referring now to FIG. 7, a schematic diagram for one embodiment of a phase-locked loop (PLL) 710 is shown, in accordance with the present invention. In alternate embodiments, PLL 710 may be implemented using components, configurations, and functions in addition to, or instead of, certain of those components, configurations, and functions discussed in conjunction with the FIG. 7 embodiment.

In the FIG. 7 embodiment, PLL 710 performs a clock regeneration procedure to regenerate a clock signal 718 for synchronizing any appropriate devices or processes (for example, the receiver 122 of FIG. 2). In the FIG. 7 embodiment, a Voltage-Controller Oscillator (VCO) 714 generates the clock signal 718. Phase/frequency detector 722 compares the clock signal 718 to a reference signal 726 and provides either an up signal 730 (see FIG. 6) or a down signal 734 to charge pump 738, depending upon whether the frequency of clock signal 718 needs to be raised or lowered in order to match reference signal 726. Charge pump 738 then provides charge pump output current to a loop filter comprised of capacitor C2 (742), resistor Rd (746), and capacitor C1 (750). The loop filter provides a loop filter voltage 720 to a summing node 758.

In the FIG. 7 embodiment, phase/frequency detector 722 also provides the foregoing up signal 730 and down signal 734 to a phase error detector 762 that generates either a count up signal 770 or a count down signal 774 to an up/down counter 778. In the FIG. 7 embodiment, phase error detector 762 generates count up signal 770 in response to a phase-error (PE) clock 766 when up signal 730 from phase/frequency detector 722 is active. Conversely, phase error detector 762 generates count down signal 774 in response to the phase-error (PE) clock 766 when down signal 734 from phase/frequency detector 722 is active. One example for the operation of phase error detector 762 is further discussed in conjunction with FIG. 8.

In the FIG. 7 embodiment, when count up signal 770 is active, up/down counter 778 sequentially increments a counter value in response to a counter clock 782. Conversely, when count down signal 774 is active, up/down counter sequentially decrements the counter value in response to counter clock 782. In the FIG. 7 embodiment, up/down counter 778 then provides the counter value to a digital-to-analog converter (DAC) 790 that converts the counter value into an analog drive voltage 794 that is then provided to summing node 758. In alternate embodiments, the foregoing up/down counter may be utilized to adjust the frequency of the VCO in proportion to the counter value by utilizing appropriate techniques other than generating a VCO control voltage with a digital-to-analog converter. For example, the counter value may be utilized to control the VCO in proportion to the counter value by adjusting a current value, a capacitance value, or a total number of delay elements.

In the FIG. 7 embodiment, summing node 758 combines the drive voltage 794 with the foregoing loop filter voltage 720 to thereby generate a VCO control voltage 754 for adjusting the frequency of the clock signal 718 generated by VCO 714. In the FIG. 7 embodiment, the present invention is disclosed and discussed as being implemented primarily as hardware circuitry. However, in alternate embodiments, certain of the functions of the present invention may be performed by appropriate software instructions that are executed for performing functions that are equivalent to those functions of the hardware circuitry discussed herein. The operation of phase error detector 762 is further discussed below in conjunction with FIG. 8.

Figure 8:
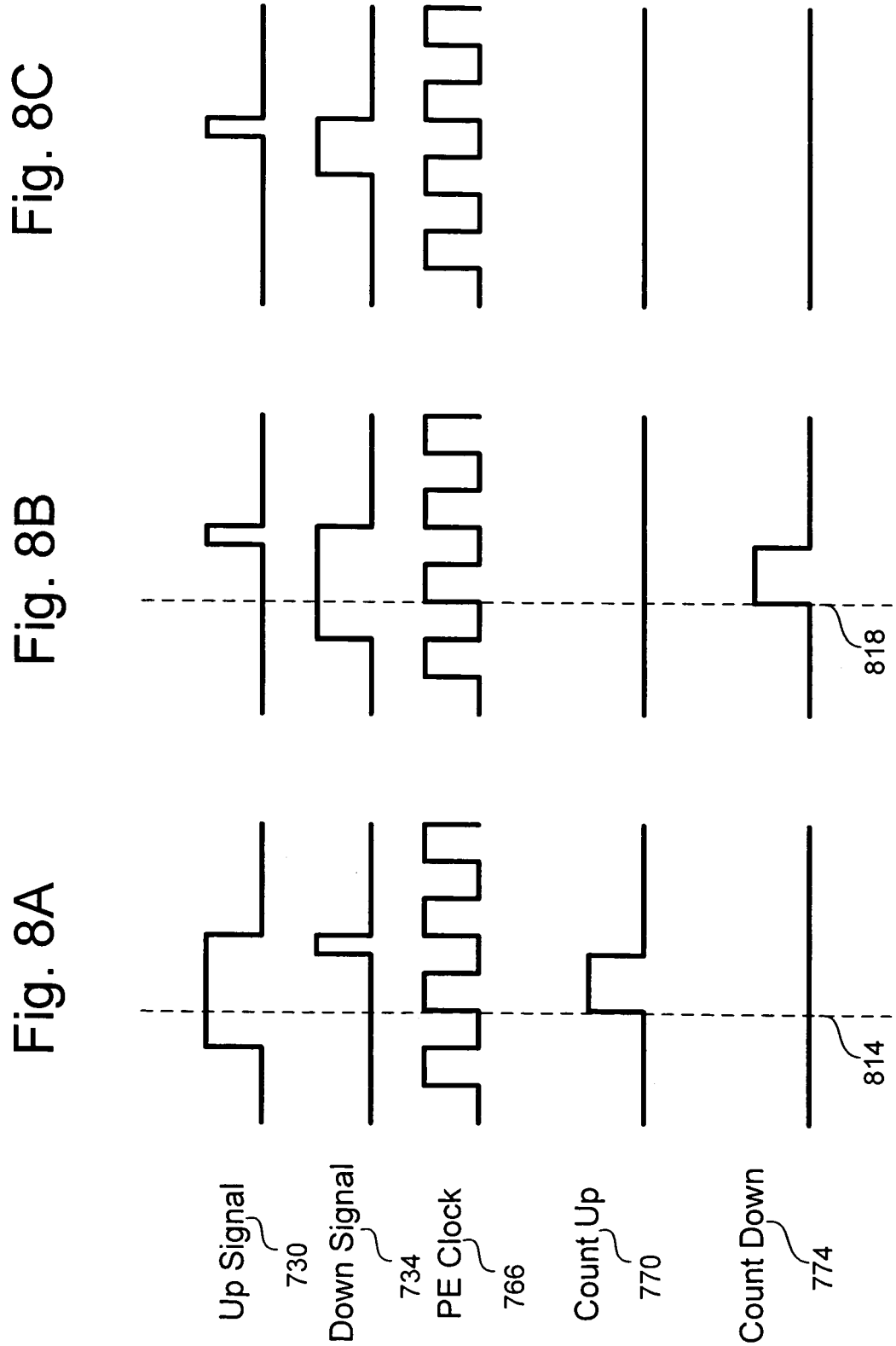
FIGS. 8A-8C are exemplary timing diagrams for the phase error detector of FIG. 7, in accordance with one embodiment of the present invention.

Referring now to FIGS. 8A-8C, exemplary timing diagrams for the FIG. 7 phase error detector 762 are shown, in accordance with one embodiment of the present invention. The FIG. 8 waveforms are presented for purposes of illustration. In alternate embodiments, phase error detector 762 may utilize waveforms, timing relationships, and functionalities, in addition to, or instead of, certain of those waveforms, timing relationships, and functionalities discussed in conjunction with the FIG. 8 embodiment.

In the FIG. 8 embodiment, the waveform timing diagram includes a an up signal 730, a down signal 734, a PE clock 766, a count up signal 770, and a count down signal 774 (see FIG. 7). In the FIG. 8 embodiment, a count up pulse 770 or a count down pulse 774 is generated at the leading edge of PE clock 766, depending upon whether up signal 730 leads or lags down signal 734 by a predefined time period. In FIG. 8A, at time 814, count up 770 is activated because up signal 730 leads down signal 734 by more than the predefined time period. Conversely, In FIG. 8B, at time 818, count down 774 is activated because up signal 730 lags down signal 734 by more than the predefined time period. In FIG. 8C, neither count up 770 nor count down 774 is activated because up signal 730 and down signal 734 are not offset by more than the predefined time period.

Figure 9:
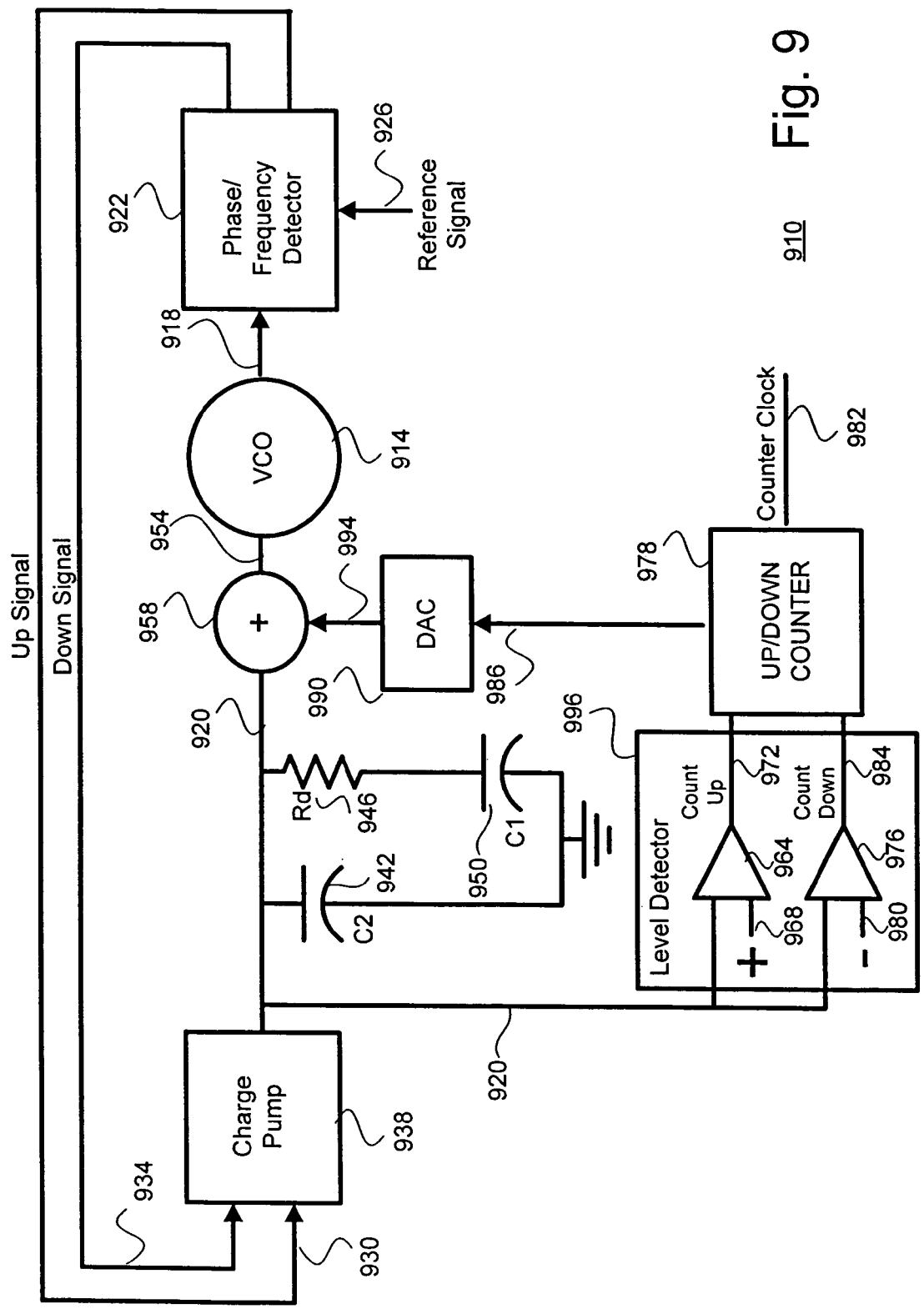
FIG. 9 is a schematic diagram for one embodiment of a phase-locked loop, in accordance with the present invention.

Referring now to FIG. 9, a schematic diagram for one embodiment of a phase-locked loop (PLL) 910 is shown, in accordance with the present invention. In alternate embodiments, PLL 910 may be implemented using components and configurations in addition to, or instead of, certain of those components and configurations discussed in conjunction with the FIG. 9 embodiment.

In the FIG. 9 embodiment, PLL 910 performs a clock regeneration procedure to regenerate a clock signal 918 for synchronizing any appropriate devices or processes (for example, the receiver 122 of FIG. 2). In the FIG. 9 embodiment, a Voltage-Controller Oscillator (VCO) 914 generates the clock signal 918. Phase/frequency detector 922 compares the clock signal 918 to a reference signal 926 and provides either an up signal 930 (see FIG. 6) or a down signal 934 to charge pump 938, depending upon whether the frequency of clock signal 918 needs to be raised or lowered in order to match reference signal 926. Charge pump 938 then provides charge pump output current to a loop filter comprised of capacitor C2 (942), resistor Rd (946), and capacitor C1 (950). The loop filter provides a loop filter voltage 920 to a summing node 958.

In the FIG. 9 embodiment, the loop filter also provides the foregoing loop filter voltage 920 to a level detector 996 that generates either a count up signal 972 or a count down signal 984 to an up/down counter 978. In the FIG. 9 embodiment, level detector 996 uses an upper comparator 964 that activates count up signal 972 when loop filter voltage 920 is above a predefined upper threshold 968. Conversely, level detector 996 uses a lower comparator 976 that activates count down signal 984 when loop filter voltage 920 is below a predefined lower threshold voltage 980. One example for the operation of level detector 996 is further discussed in conjunction with FIG. 10.

In the FIG. 9 embodiment, when count up signal 972 is active, up/down counter 978 sequentially increments a counter value in response to a counter clock 982. Conversely, when count down signal 984 is active, up/down counter 978 sequentially decrements the counter value in response to counter clock 982. In the FIG. 9 embodiment, up/down counter 978 then provides the counter value 986 to a digital-to-analog converter (DAC) 990 that converts the counter value into an analog drive voltage 994 that is then provided to summing node 958. In alternate embodiments, the foregoing up/down counter may be utilized to adjust the frequency of the VCO in proportion to the counter value by utilizing appropriate techniques other than generating a VCO control voltage with a digital-to-analog converter. For example, the counter value may be utilized to control the VCO in proportion to the counter value by adjusting a current value, a capacitance value, or a total number of delay elements.

In the FIG. 9 embodiment, summing node 958 combines the drive voltage 994 with the foregoing loop filter voltage 920 to thereby generate a VCO control voltage 954 for adjusting the frequency of the clock signal 918 generated by VCO 914. In the FIG. 9 embodiment, the present invention is disclosed and discussed as being implemented primarily as hardware circuitry. However, in alternate embodiments, certain of the functions of the present invention may be performed by appropriate software instructions that are executed for performing functions that are equivalent to those functions of the hardware circuitry discussed herein.

Figure 10:
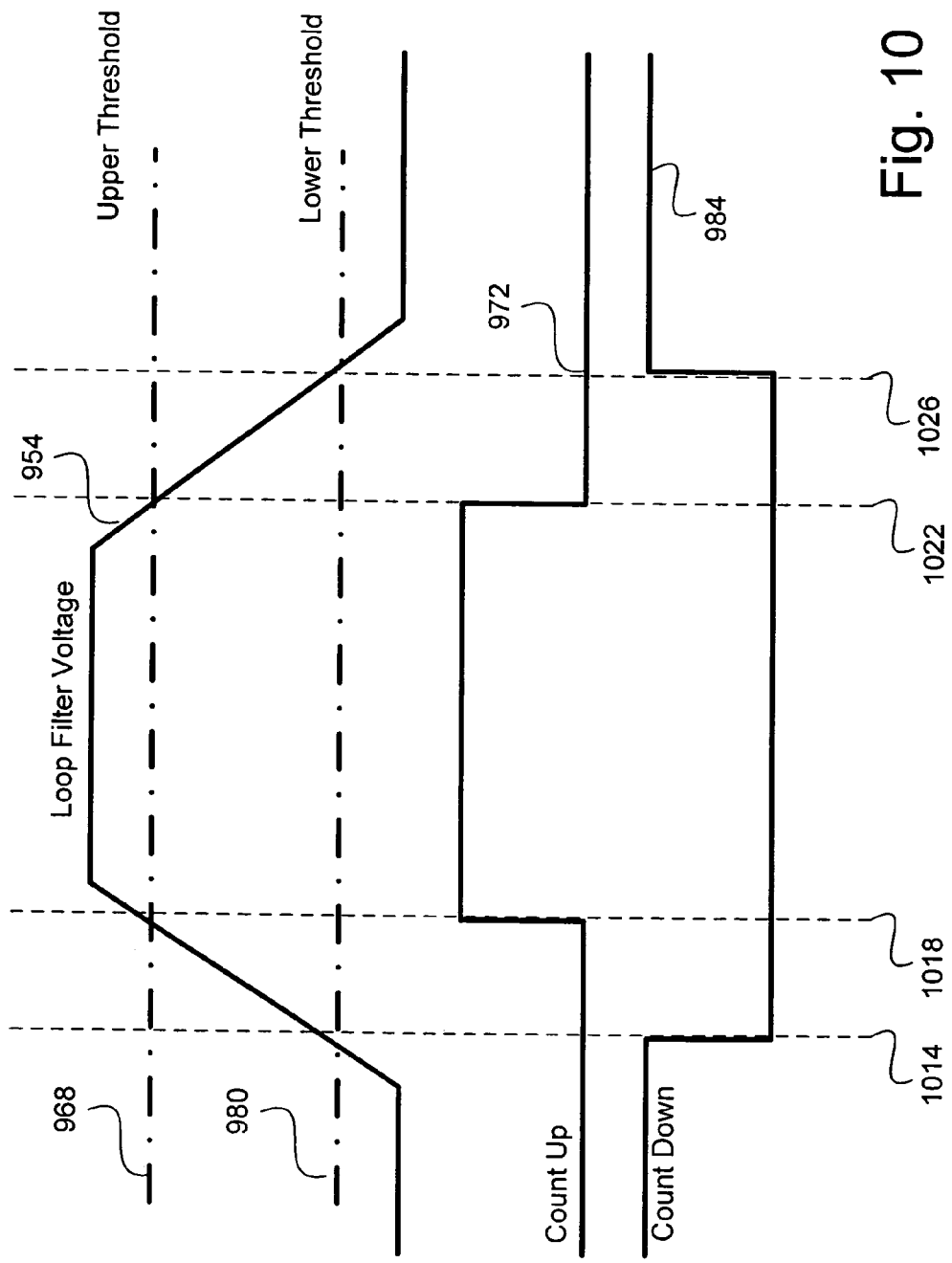
FIG. 10 is a waveform timing diagram for the level detector of FIG. 9, in accordance with one embodiment of the present invention.
Figure 11:
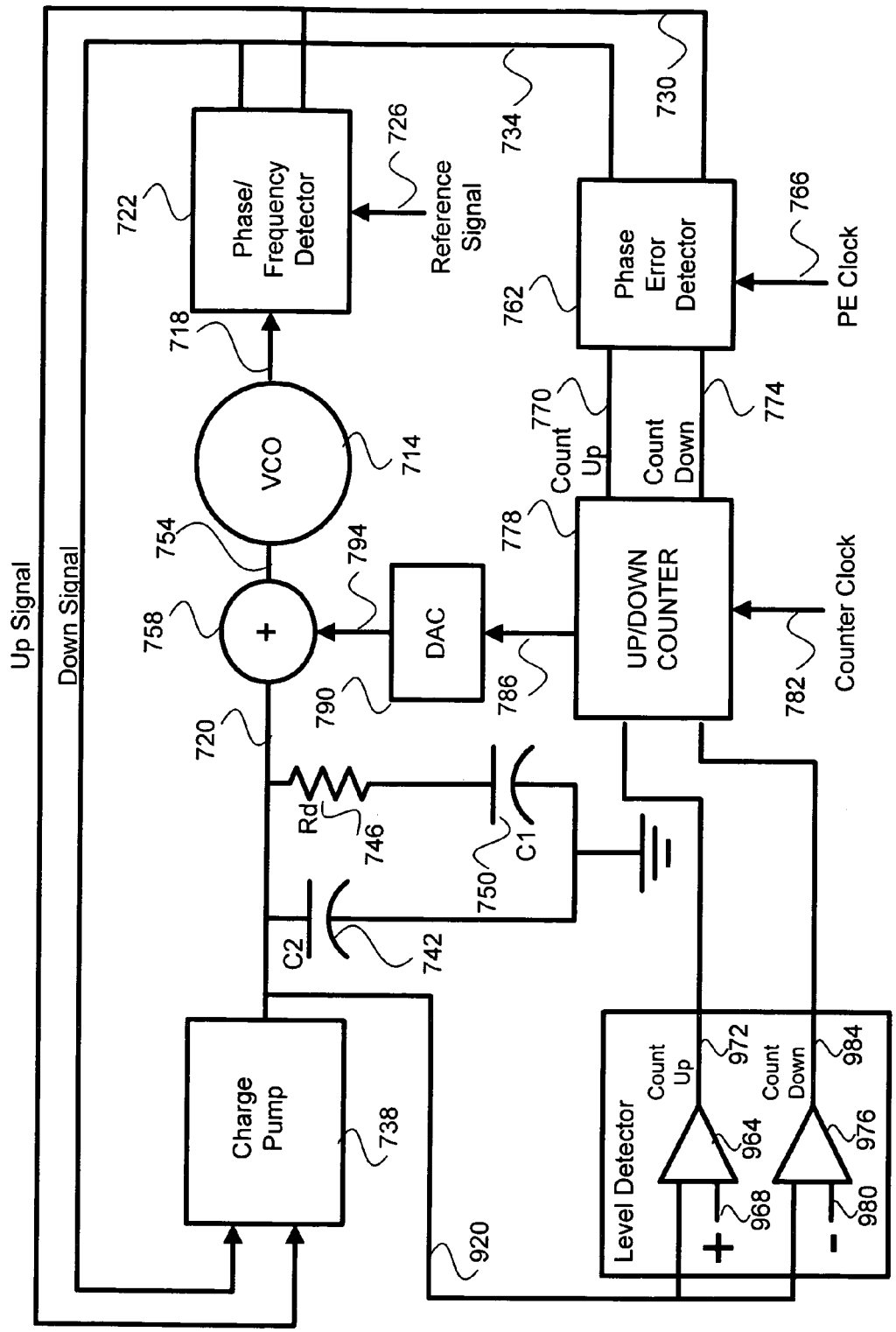
FIG. 11 is a schematic diagram for one embodiment of a phase-locked loop, in accordance with the present invention.

In certain embodiments, the level detector 996 of FIG. 9 may be added to the PLL 710 of FIG. 7 to improve overall performance characteristics of the resultant combination PLL 1100 (see FIG. 11). In accordance with this combination PLL 1100, the phase error detector 762 (see FIG. 7) may be utilized for normal control of VCO 714. However, in certain circumstances under which the frequency of clock signal 718 changes at a rate that is too slow for phase error detector 762 to detect (such as during incremental temperature shifts), level detector 996 (see FIG. 9) may be utilized to control VCO 714 since level detector 996 generates control signals that are based upon specific fixed threshold voltages. The operation of level detector 996 is further discussed below in conjunction with FIG. 10.

Referring now to FIG. 10, an exemplary timing diagram for the FIG. 9 level detector 996 is shown, in accordance with one embodiment of the present invention. The FIG. 10 waveforms are presented for purposes of illustration. In alternate embodiments, level detector 996 may utilize waveforms, timing relationships, and functionalities, in addition to, or instead of, certain of those waveforms, timing relationships, and functionalities discussed in conjunction with the FIG. 10 embodiment.

In the FIG. 10 embodiment, the waveform timing diagram includes a loop filter voltage 954 with an upper threshold voltage 968 and a lower threshold voltage 980 (see FIG. 9). In the FIG. 10 example, count down signal 984 is active until loop filter voltage 954 becomes greater than lower threshold 980 at time 1014. At time 1018, count up signal 972 becomes active when loop filter voltage 954 becomes greater than upper threshold 968. At time 1022, count up signal 9972 becomes inactive when loop filter voltage 954 becomes less than upper threshold 968. At time 1026, count down signal 972 becomes active when loop filter voltage 954 becomes less than lower threshold 980. In the FIG. 10 embodiment, both count up signal 972 and count down signal 984 are inactive while loop filter voltage 954 falls somewhere between upper threshold 968 and lower. threshold 980.

The invention has been explained above with reference to certain embodiments. Other embodiments will be apparent to those skilled in the art in light of this disclosure. For example, the present invention may readily be implemented using configurations and techniques other than those described in the embodiments above. Additionally, the present invention may effectively be used in conjunction with systems other than those described above. Therefore, these and other variations upon the discussed embodiments are intended to be covered by the present invention, which is limited only by the appended claims.

What is claimed is:

1. An apparatus for implementing a phase-locked loop, comprising:
    a voltage-controlled oscillator that generates a primary clock signal in response to a VCO control means;
    detection means that generates counter control signals to indicate a current relationship between said primary clock signal and a reference signal, said detection means including a phase/frequency detector that generates either an up signal or a down signal based upon said counter control signals, said detection means also including a detector module that receives said up signal and said down signal and responsively generates either a count up signal or a count-down signal to said up/down counter;
    an up/down counter that updates a counter value in response to said counter control signals, said counter value being converted into said VCO control means for adjusting said voltage-controlled oscillator; and
    a digital-to-analog converter that transforms said counter value into said VCO control means for adjusting an operating frequency of said voltage-controlled oscillator.

2. An apparatus for implementing a phase-locked loop, comprising:
    a voltage-controlled oscillator that generates a primary clock signal in response to a VCO control means;
    detection means that generates counter control signals to indicate a current relationship between said primary clock signal and a reference signal; and
    an up/down counter that updates a counter value in response to said counter control signals, said counter value being converted into said VCO control means for adjusting said voltage-controlled oscillator, said detection means including a phase/frequency detector that originates said counter control signals for controlling said up/down counter, said phase/frequency detector generating an up signal when said primary clock signal lags said reference signal, said phase/frequency detector conversely generating a down signal when said primary clock signal leads said reference signal, said detection means including a phase error detector that receives said up signal and said down signal, said phase error detector generating a count up signal to said up/down counter when said up signal is active, said phase error detector generating a count down signal to said up/down counter when said down signal is active.

3. The apparatus of claim 2 wherein said phase error detector generates said count up signal and said count down signal in response to a phase error clock signal whenever said up signal and said down signal are offset by more than a predefined time period.

4. An apparatus for implementing a phase-locked loop, comprising:
    a voltage-controlled oscillator that generates a primary clock signal in response to a VCO control means;
    detection means that generates counter control signals to indicate a current relationship between said primary clock signal and a reference signal; and
    an up/down counter that updates a counter value in response to said counter control signals, said counter value being converted into said VCO control means for adjusting said voltage-controlled oscillator, said detection means including a phase/frequency detector that originates said counter control signals for controlling said up/down counter, said phase/frequency detector generating an up signal when said primary clock signal lags said reference signal, said phase/frequency detector conversely generating a down signal when said primary clock signal leads said reference signal, said up signal and said down signal being provided to a charge pump and a loop filter that responsively generate a loop filter voltage.

5. The apparatus of claim 4 wherein said loop filter includes a first capacitor in series with a resistor, and a second capacitor in parallel with said first capacitor and said resistor, said first capacitor being implemented on an integrated circuit device along with said phase-locked loop.

6. The apparatus of claim 4 wherein said detection means includes a level detector that receives said loop filter voltage, said level detector activating either a count up signal or a count down signal to said up/down counter depending upon a current value of said loop filter voltage.

7. The apparatus of claim 4 wherein said level detector includes an upper comparator that generates said count up signal, said level detector also including a lower comparator that generates said count down signal.

8. The apparatus of claim 7 wherein said upper comparator activates said count up signal when said loop filter voltage is greater than a predefined upper threshold voltage, said lower comparator generating said count down signal when said loop filter voltage is less than a predefined lower threshold voltage.

9. The apparatus of claim 7 further comprising a summing node that sums said loop filter voltage together with information proportionally derived from said counter value to produce said VCO control means.

10. An apparatus for implementing a phase-locked loop, comprising:

a voltage-controlled oscillator that generates a primary clock signal in response to a VCO control means;

detection means that generates counter control signals to indicate a current relationship between said primary clock signal and a reference signal; and an up/down counter that updates a counter value in response to said counter control signals, said counter value being converted into said VCO control means for adjusting said voltage-controlled oscillator, said detection means including both a phase error detector and a level detector that concurrently function together in a cooperative manner to control said voltage-controlled oscillator.

11. The apparatus of claim 10 wherein said level detector supplements said phase error detector by adjusting said voltage-control oscillator to compensate for incremental temperature changes that are not detected by said phase error detector.

\* \* \* \* \*